United States Patent
Tsai et al.

(10) Patent No.: US 10,156,526 B1
(45) Date of Patent: Dec. 18, 2018

(54) METHOD FOR REVIEWING DEFECTS

(71) Applicant: UNITED MICROELECTRONICS CORP., Hsin-Chu (TW)

(72) Inventors: Yung-Teng Tsai, Tainan (TW); Hung-Chin Lin, Tainan (TW); Chia-Chen Sun, Kaohsiung (TW); Chih-Yu Wu, Tainan (TW); Jun-Ming Chen, Hsinchu (TW); Chung-Chih Hung, Kaohsiung (TW); Sheng-Chieh Chen, Tainan (TW)

(73) Assignee: UNITED MICROELECTRONICS CORP., Hsin-Chu (TW)

( * ) Notice: Subject to any disclaimer, the term of this patent is extended or adjusted under 35 U.S.C. 154(b) by 0 days.

(21) Appl. No.: 16/108,054

(22) Filed: Aug. 21, 2018

Related U.S. Application Data

(62) Division of application No. 15/396,805, filed on Jan. 2, 2017, now Pat. No. 10,082,471.

(51) Int. Cl.
| | | |
|---|---|---|
| G01N 21/00 | (2006.01) | |
| G01N 21/93 | (2006.01) | |
| G01N 21/95 | (2006.01) | |
| H01L 23/544 | (2006.01) | |
| H01L 21/66 | (2006.01) | |

(52) U.S. Cl.
CPC ......... *G01N 21/93* (2013.01); *G01N 21/9501* (2013.01); *H01L 22/32* (2013.01); *H01L 23/544* (2013.01); *H01L 2223/5446* (2013.01); *H01L 2223/54426* (2013.01)

(58) Field of Classification Search
CPC .............. G03F 9/7084; G03F 9/7088; G06T 2207/30148; G06T 2207/10061; G06T 2207/20081; G01N 21/9501; G01N 21/956; G01N 21/9505; G01N 21/95607; G01N 21/4785; H01L 21/6836; H01L 21/308; H01L 21/78
USPC .......... 356/399–401, 237.1–237.5; 257/620, 257/797; 382/149
See application file for complete search history.

(56) References Cited

U.S. PATENT DOCUMENTS

| | | | |
|---|---|---|---|
| 6,680,484 B1 | 1/2004 | Young | |
| 7,231,079 B2* | 6/2007 | Okuda | ............... G01N 21/9501 382/145 |
| 8,094,924 B2 | 1/2012 | Jau et al. | |
| 2003/0209812 A1 | 11/2003 | Nin | |
| 2008/0058977 A1* | 3/2008 | Honda | ...................... G03F 1/86 700/110 |
| 2009/0268959 A1* | 10/2009 | Harada | ................... G06T 7/001 382/149 |
| 2011/0115057 A1 | 5/2011 | Harn et al. | |
| 2012/0299159 A1 | 11/2012 | Chen | |

(Continued)

OTHER PUBLICATIONS

Patterson et al., Automated SEM Offset Using Programmed Defects, 2011.

*Primary Examiner* — Hoa Q Pham
(74) *Attorney, Agent, or Firm* — Winston Hsu

(57) ABSTRACT

A semiconductor structure includes a wafer comprising a plurality of viewing fields defined thereon, a plurality of dies defined by a scribe line formed in each viewing field, a plurality of mark patterns formed in the scribe line, and a plurality of anchor pattern respectively formed in the review fields, the anchor patterns being different from the mark patterns.

8 Claims, 8 Drawing Sheets

(56) References Cited

U.S. PATENT DOCUMENTS

| | | | |
|---|---|---|---|
| 2013/0163851 A1* | 6/2013 | Dalla-Torre | G06T 7/001 |
| | | | 382/149 |
| 2014/0002822 A1 | 1/2014 | Chen | |
| 2014/0051189 A1 | 2/2014 | Kai-Jun | |
| 2014/0219543 A1* | 8/2014 | Kuo | G06T 7/001 |
| | | | 382/149 |
| 2015/0241790 A1 | 8/2015 | Pierson | |
| 2017/0047195 A1* | 2/2017 | Lee | H01J 37/222 |
| 2017/0337673 A1* | 11/2017 | Tseng | G06T 7/001 |
| 2018/0158735 A1 | 6/2018 | Huang | |

* cited by examiner

METHOD FOR REVIEWING DEFECTS

CROSS REFERENCE TO RELATED APPLICATIONS

This application is a divisional application of and claims the benefit of U.S. patent application Ser. No. 15/396,805, filed Jan. 2, 2017.

BACKGROUND OF THE INVENTION

1. Field of the Invention

The present invention relates to a semiconductor structure and a method for reviewing defects, and more particularly, to a semiconductor structure involved in the method for reviewing defects in manufactured semiconductor substrates.

2. Description of the Prior Art

A semiconductor device is formed after a semiconductor substrate undergoes a plurality of manufacturing steps of oxidization, film deposition, lithography, etching, etc. In the semiconductor manufacturing, it is important to find defects appearing during a manufacturing step in early phases and take measures against the defects in order to ensure yield enhancement. And thus defect inspection systems and defect review systems are required.

Defect inspection detects particles, pattern anomalies, and process-induced anomalies on wafers and reticles. The inspection process typically only involves detecting defects on the wafer/substrate and providing limited information such coordinates indicating defect locations, number of defects, and sometimes defect size. And typically detection results from the inspection systems are fed to defect review systems. As the dimensions of semiconductor devices decrease, detection of defects has become necessary since even relatively small defects may cause unwanted aberrations in the semiconductor devices.

Defect review is often used to provide more information about individual defects than that which can be from the inspection results. For instance, a defect review may be used to revisit the defects detected on the wafer/substrate and to examine the defects further. Defect review typically involves generating more detailed information about the defects at a higher resolution.

It is concluded that defect inspection and defect review systems are two significant means for semiconductor yield management. Conventionally, as the defect locations is detected and the coordinates of these defects are fed to the defect review system, the substrate/wafer is aligned on the stage of the review system and the coordinates are used by the defect review system to find the defects. Therefore, alignments between the defect inspection system and defect review system are important.

SUMMARY OF THE INVENTION

According to an aspect of the present invention, a semiconductor structure is provided. The semiconductor structure includes a wafer comprising a plurality of viewing fields defined thereon, a plurality of dies defined by a scribe line formed in each viewing field, a plurality of mark patterns formed in the scribe line, and a plurality of anchor patterns respectively formed in the review fields. More important, the anchor patterns are different from the mark patterns.

According to an aspect of the present invention, a method for reviewing defects is provided. The method for reviewing defects includes following steps. A wafer and sets of coordinates locating a plurality of defects formed on the wafer are received in a defect review apparatus. Next, a plurality of viewing fields on the wafer are identified and a plurality of origin points respectively in the viewing fields are recognized in the defect review apparatus. And each viewing field includes a plurality of dies formed therein. Thereafter, a first review step is performed to review a plurality of anchor patterns in the viewing fields, and followed by performing an offset correction after the first review step to re-locate the defects. Then a second review step is performed to review the defects after the offset correction.

According to the semiconductor structure provided by the present invention, the anchor patterns that are different from the mark patterns are formed in the viewing fields and thus the first reviewing step is performed to review the anchor patterns. The offset correction therefore can be easily achieved to re-locate the defects because the deviation between the origin points and the anchor patterns or the deviation between the coordinates locating the defects and the anchor patterns is easily obtained. Accordingly, the second reviewing step is performed to review the real defects with accurate and precise coordinates. And thus the method for reviewing defects provided by the present invention provides high working efficiency and an improved reliability.

These and other objectives of the present invention will no doubt become obvious to those of ordinary skill in the art after reading the following detailed description of the preferred embodiment that is illustrated in the various figures and drawings.

DETAILED DESCRIPTION

In the following description, numerous specific details are set forth, such as particular structures, components, materials, dimensions, processing steps and techniques, in order to provide a thorough understanding of the present invention. However, it will be appreciated by one of ordinary skill in the art that the invention may be practiced without these specific details. In other instances, well-known structures or processing steps have been described in detail in order to avoid obscuring the invention.

It will be understood that when an element is referred to as being "formed" on another element, it can be directly or indirectly, formed on the given element by growth, deposition, etch, attach, connect, or couple. And it will be understood that when an elements or a layer is referred to as being "on", "connected to", or "coupled to" another element or layer, it can be directly on, connected or coupled to the other element or layer or intervening elements or layers may be present.

It will be understood that, although the terms first, second, etc. may be used herein to describe various elements, components, regions, layers and/or sections, these elements, components, regions, layers and/or sections should not be limited by these terms. These terms are only used to distinguish one element, component, region, layer and/or section from another. Thus, a first element, component, region, layer or section discussed below could be termed a second element, component, region, layer or section without departing from the teachings of the disclosure.

Spatially relative terms, such as "beneath", "below", "lower", "above", "upper", "in", "on" and the like, may be used herein for ease of description to describe one element or feature's relationship to another element (s) or feature (s) as illustrated in the figures. It will be understood that spatially relative terms are intended to encompass different orientations of the device in use or operation in addition to the orientations depicted in the figures. For example, if the device in the figures in turned over, elements described as "below" or "beneath" can encompass both an orientation of above and below. The device may be otherwise oriented (rotated 90 degrees or at other orientations) and the spatially relative descriptors used herein interpreted accordingly.

The terminology used herein is for the purpose of describing particular embodiments and is not intended to be limiting of the inventions. As used herein, the singular form "a", "an" and "the" are intended to include the plural forms as well, unless the context clearly indicates otherwise.

Figure 1:
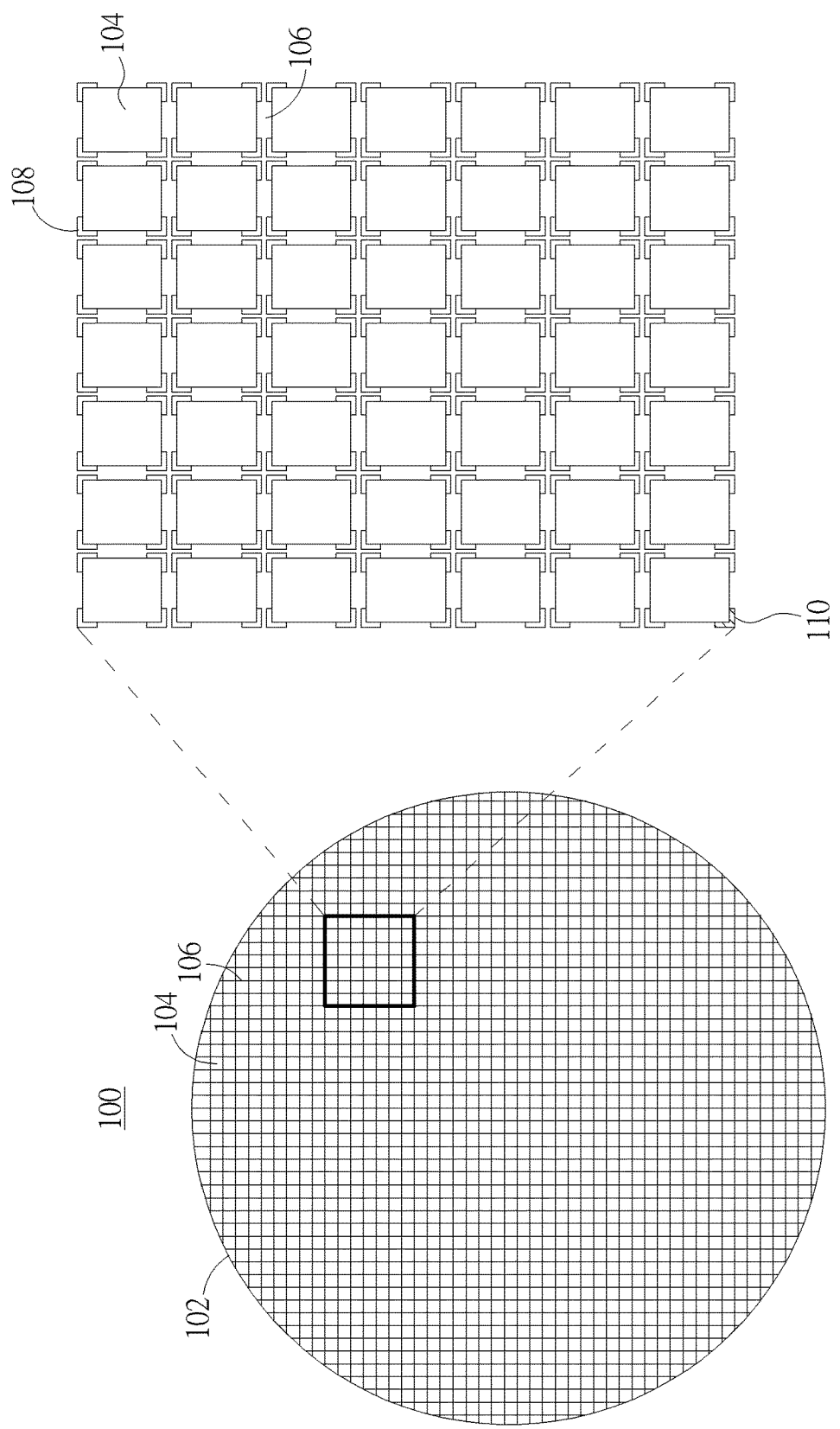
FIG. 1 is a schematic drawing illustrating a semiconductor structure provided by a preferred embodiment of the invention.

Please refer to FIG. 1, which is a schematic drawing illustrating a semiconductor structure provided by a first preferred embodiment of the invention. According to the preferred embodiment, a semiconductor structure 100 is provided. The semiconductor structure 100 includes a wafer 102 and a plurality of dies 104 defined by a scribe line 106. According to the preferred embodiment, the wafer 102 generally refers to a substrate formed of semiconductor material, non-semiconductor material, or any base material on which processing is conducted to produce layers of material, pattern features, and/or integrated circuits. The wafer 102 may include one or more layers formed thereon. For example but not limited to, the layer may include a resist, a dielectric material, a conductive material, or a semiconductor material. It some embodiments of the present invention, the wafer 102 is intended to encompass a wafer including all types such layer. Furthermore, the layer(s) formed on the wafer 102 may be patterned and thus patterned features are formed. Therefore the wafer 102 may include the plurality of dies 104 defined by the scribe line 106, and each die 104 includes the patterned features constructing different types of devices. In some embodiments of the present invention, the wafer 102 is intended to encompass a wafer on which any type of device known in the art is being fabricated.

Please refer to the right side of FIG. 1, which includes an enlarged view of the wafer 102. As shown in the right side of FIG. 1, the dies 104 are defined by the scribe line 106, and a plurality of mark patterns 108 are formed in the scribe line 106. It is noteworthy that the mark patterns 108 are immediately adjacent to corners of the dies 104 as shown in FIG. 1. The mark patterns 108 are provided to mark the edge of the dies. Furthermore, the mark patterns 108 can include alignment mark pattern in the manufacturing processes. More important, the semiconductor structure 100 includes a plurality of anchor patterns 110 formed in the scribe line 106, and the anchor patterns 110 are different from the mark patterns 108. As shown in FIG. 1, the anchor patterns 110 are formed in the scribe line 106 at a corner of the dies 104, respectively. Typically, the mark patterns 108, the anchor patterns 110 and material patterns formed in the dies 104 are formed by transferring patterns from a photomask in the photolithography technology. Moreover, this process of transferring a pattern to the wafer is repeated many times on different areas (referred to as "shots" or "fields") of the wafer 102 during a mass production process of, for example, manufacturing semiconductor chips. In some embodiments of the preset invention, the anchor patterns 110 are respectively formed at the corner of a die 104 located at a corner of a shot/field, which will be identified as a viewing field by a defect review apparatus and will be described in the following description.

Figure 2:
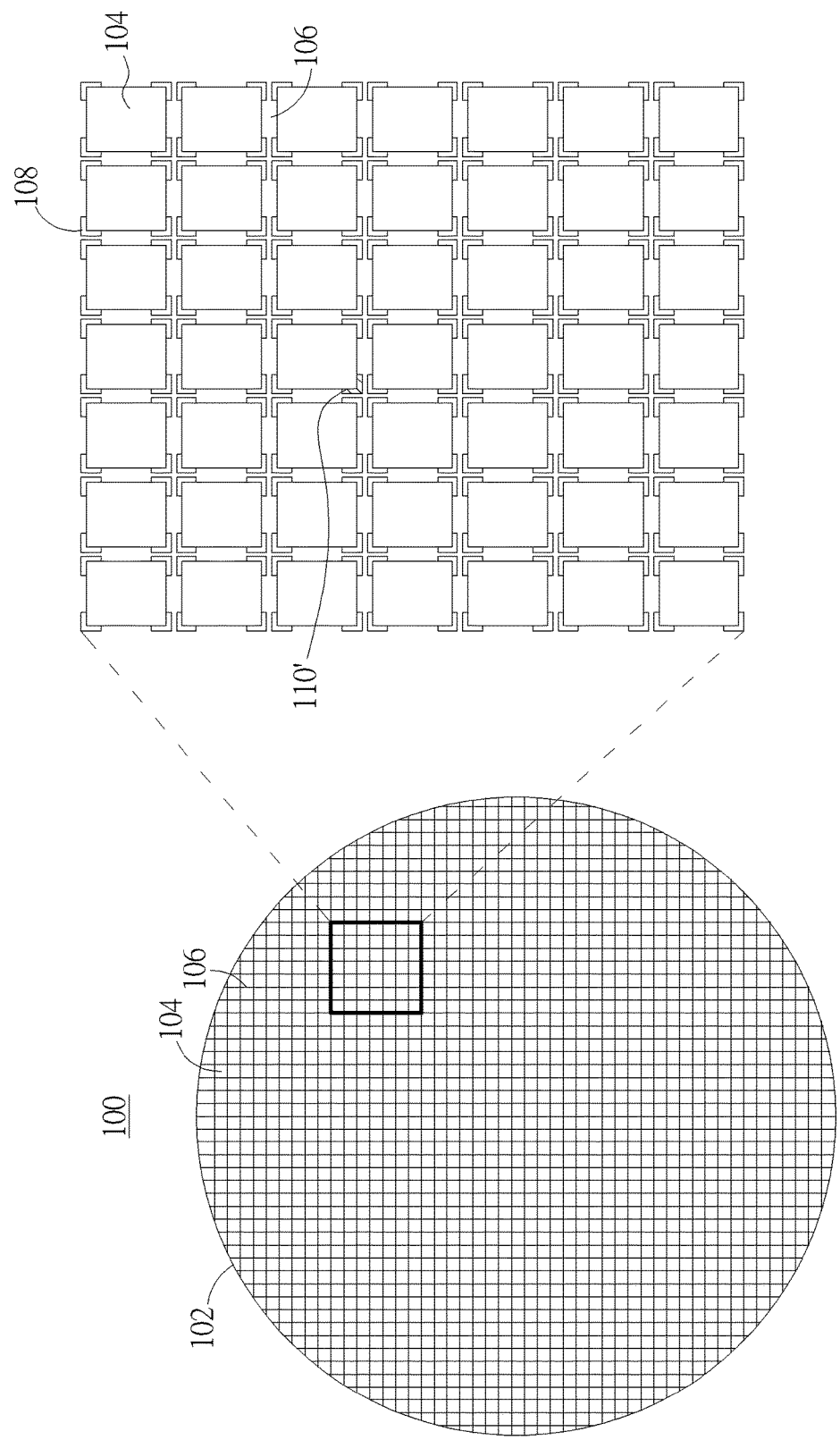
FIG. 2 is a schematic drawings illustrating a semiconductor structure provided by another preferred embodiment of the invention.

Please refer to FIG. 2, which is a schematic drawing illustrating a semiconductor structure provided by a second preferred embodiment of the invention. It is noteworthy that elements the same in the first and second preferred embodiments are designated by the same numerals, and details of those same elements are omitted in the interest of brevity. The difference between the first and second preferred embodiments is: the anchor patterns 110' are respectively formed at the corner of a die 104 not located at a corner of shot/field, which will be identified as a viewing field by a defect review apparatus and will be described in the following description.

Figure 3:
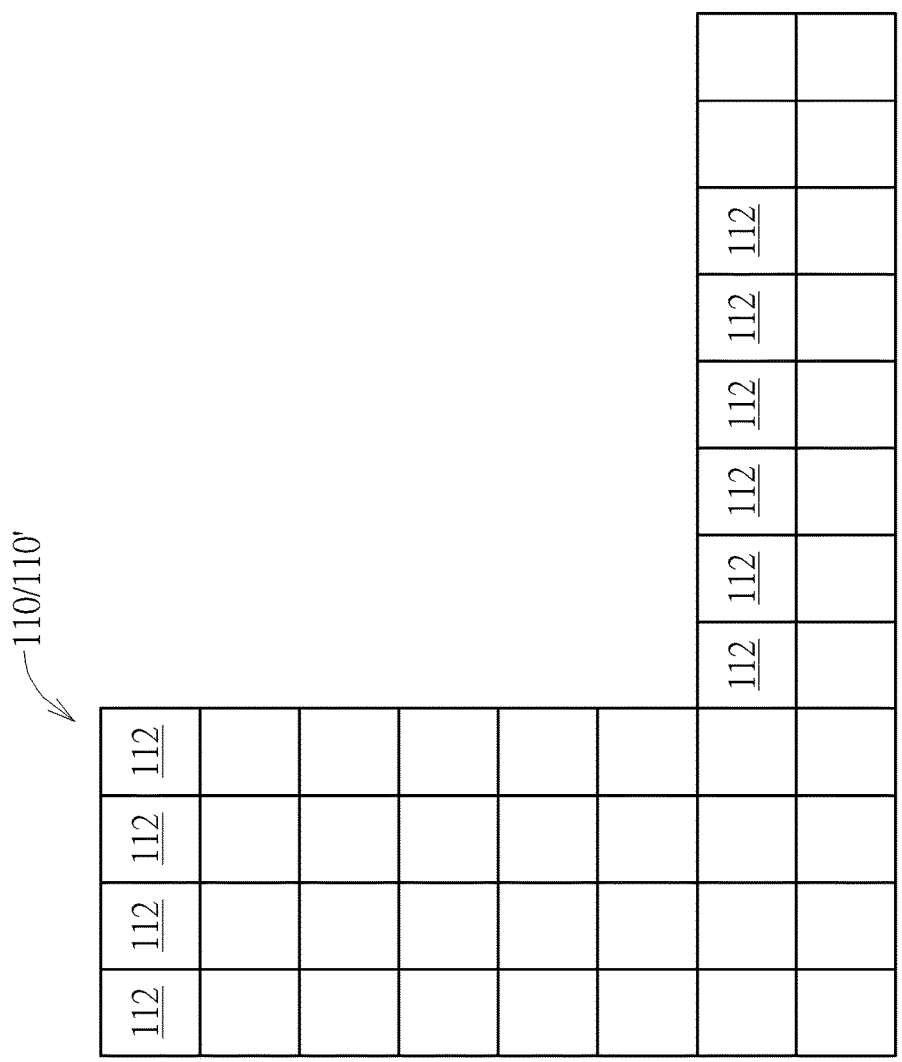
FIG. 3 is a schematic drawing illustrating the anchor pattern provided by the preferred embodiments of the present invention.

Please refer to FIG. 3, which is a schematic drawing illustrating the anchor pattern provided by the preferred embodiments of the present invention. The anchor pattern 110/110' can include a plurality of sub-patterns 112 arranged therein. As mentioned above, there are many types of layers formed and patterned on the wafer, and the layers are patterned to form the sub-patterns 112 to construct the anchor pattern 110/110'. In some embodiments of the present invention, the sub-patterns 112 respectively is a cell pattern including a plurality of insulating patterns, a plurality of semiconductor patterns such as fin patterns or gate line pattern, and/or a plurality of metal patterns such wiring patterns. It is noteworthy that the aforementioned patterns can be formed concurrently with those patterns formed within the dies 104. More important, the anchor pattern 110/110' includes at least a programmed defect 114a, 114b, 114c artificially formed in one of the sub-patterns 112.

Figure 4:
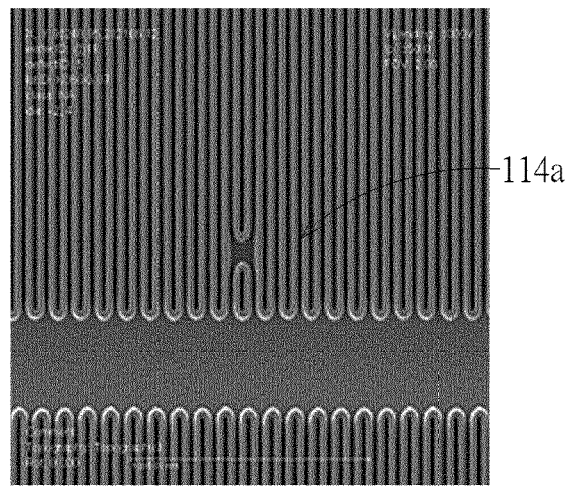
FIGS. 4-6 respectively illustrate SEM pictures of the programmed defect formed in the anchor pattern.
Figure 5:
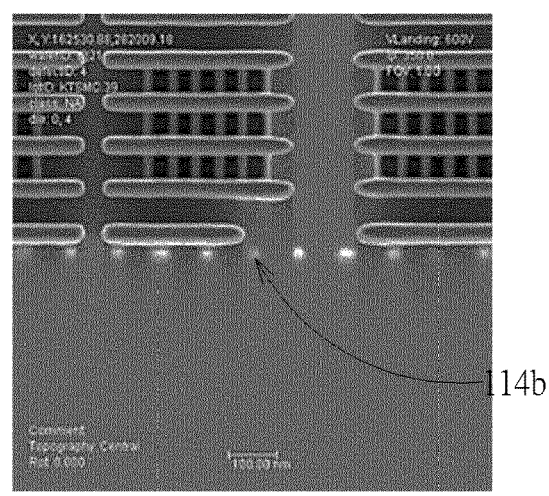
Figure 6:
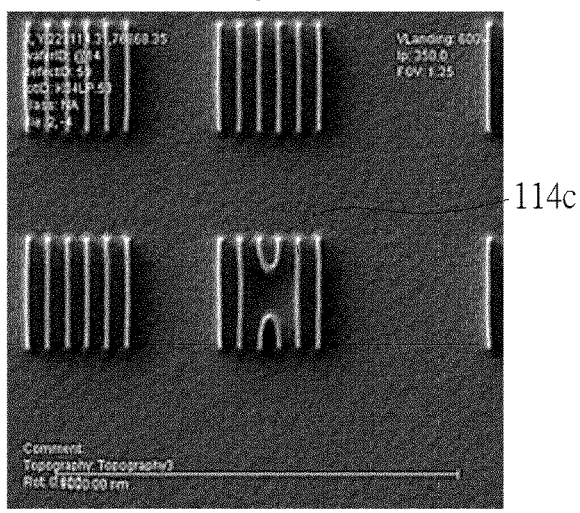

Please refer to FIGS. 4-6, which respectively illustrate a scanning electron microscope (hereinafter abbreviated as SEM) picture of the programmed defect formed in the anchor pattern. As shown in FIG. 4, the programed defect can include a gap defect 114a formed in the one of the sub-patterns 112. As shown in FIG. 5, the programmed defect can include a short-end defect 114b formed in the one of the sub-patterns 112. As shown in FIG. 6, the programmed defect can include a bridge defect 114c formed in the one of the sub-patterns 112. However, those skilled in the art would easily realize that any types of defects can be artificially formed in the sub-patterns 112.

It should be easily realized that in some embodiments of the present invention, the mark patterns 108 and the anchor patterns 110/110' can include the same shape, and the difference between the mark patterns 108 and the anchor patterns 110/110' is: the anchor patterns 110/110' include the programmed defects 114a, 114b, or 114c while the mark patterns 108 include no programmed defects. However, in still other embodiments of the present invention, the anchor patterns 110/110' and mark patterns 108 can include different shapes and/or different sizes.

Figure 7:
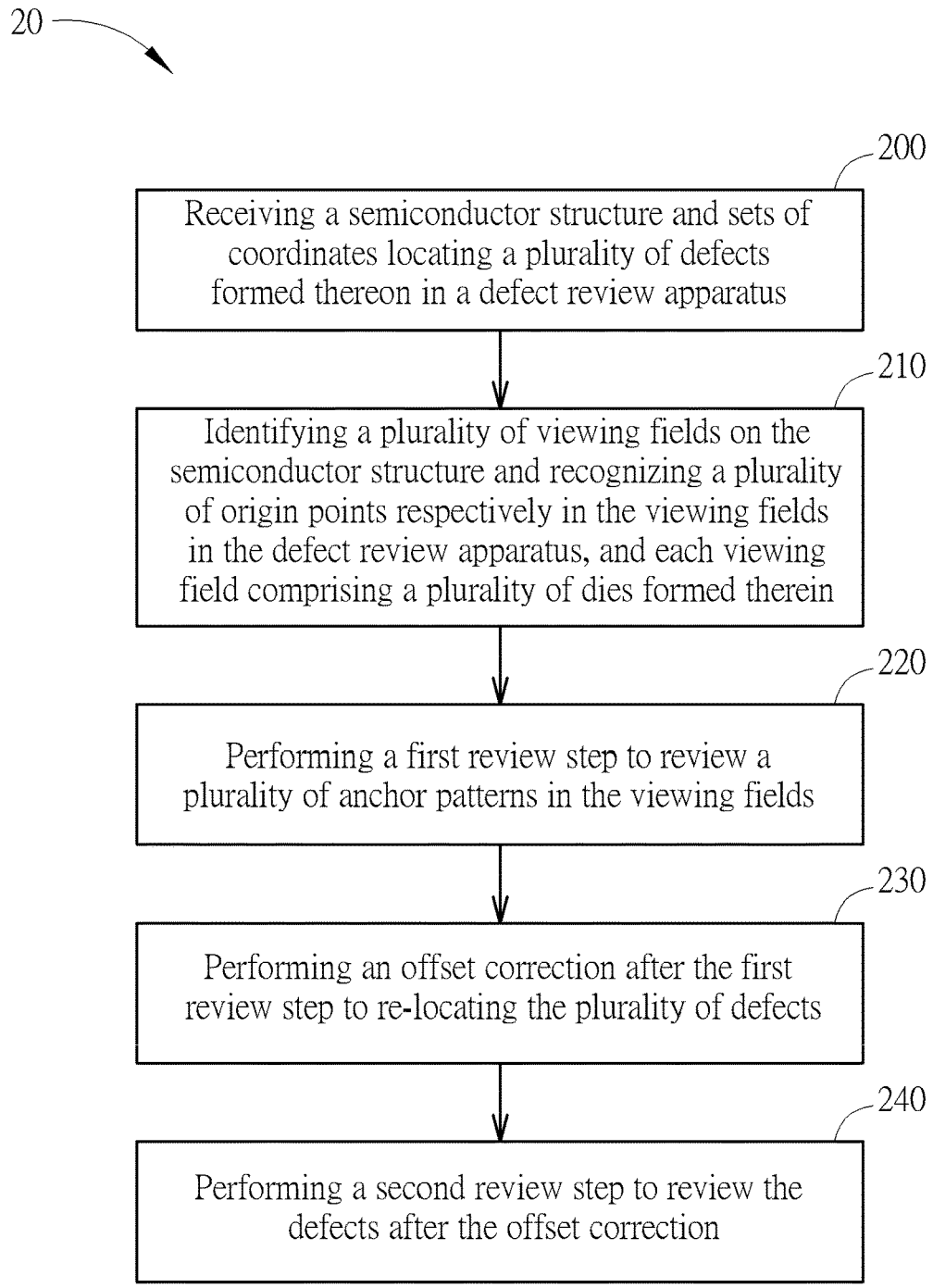
FIG. 7 is a flow chart illustrating the method for reviewing defects provided by a preferred embodiment of the present invention.

Please refer to FIG. 7, which is a flowchart illustrating the method for reviewing defects provided by a preferred embodiment of the present invention. According to the method for reviewing defects 20 provided by the preferred embodiment, a STEP 200 is performed:

STEP 200: Receiving a semiconductor structure and sets of coordinates locating a plurality of defects formed thereon in a defect review apparatus According to the preferred embodiment, a semiconductor structure 100 as mentioned above is inspected using any suitable defect inspection apparatus. The semiconductor structure 100 is inspected in a defect inspection apparatus and thus a plurality of defects may be detected and sets of coordinates locating those defects are derived from the defect inspection apparatus. As mentioned above, the semiconductor structure 100 includes the wafer 102, the plurality of dies 104 formed on the wafer 102 and defined by the scribe line 106, the plurality of mark patterns 108, and the plurality of anchor patterns 110/110'. More important, the anchor patterns 110/110' respectively include at least a programmed defect 114a, 114b and/or 114c formed therein, therefore the set of coordinates are derived to locate not only the real defect(s) in the dies 104 but also to locate the programmed defects 114a, 114b and/or 114c in the anchor patterns 110/110'. In other words, since the anchor patterns 110/110' include the programmed defects 114a, 114b and/or 114c, it will be always detected and recognized in the defect inspection apparatus.

The semiconductor structure 100/the wafer 102 is then transferred to a defect review apparatus. In some embodiments of the present invention, the defect review apparatus is preferably a scanning electron microscope (SEM)-based defect review apparatus, but not limited to this. The defect review apparatus receives the semiconductor structure 100 and the set of coordinates locating the defects from the defect inspection apparatus.

Figure 8:
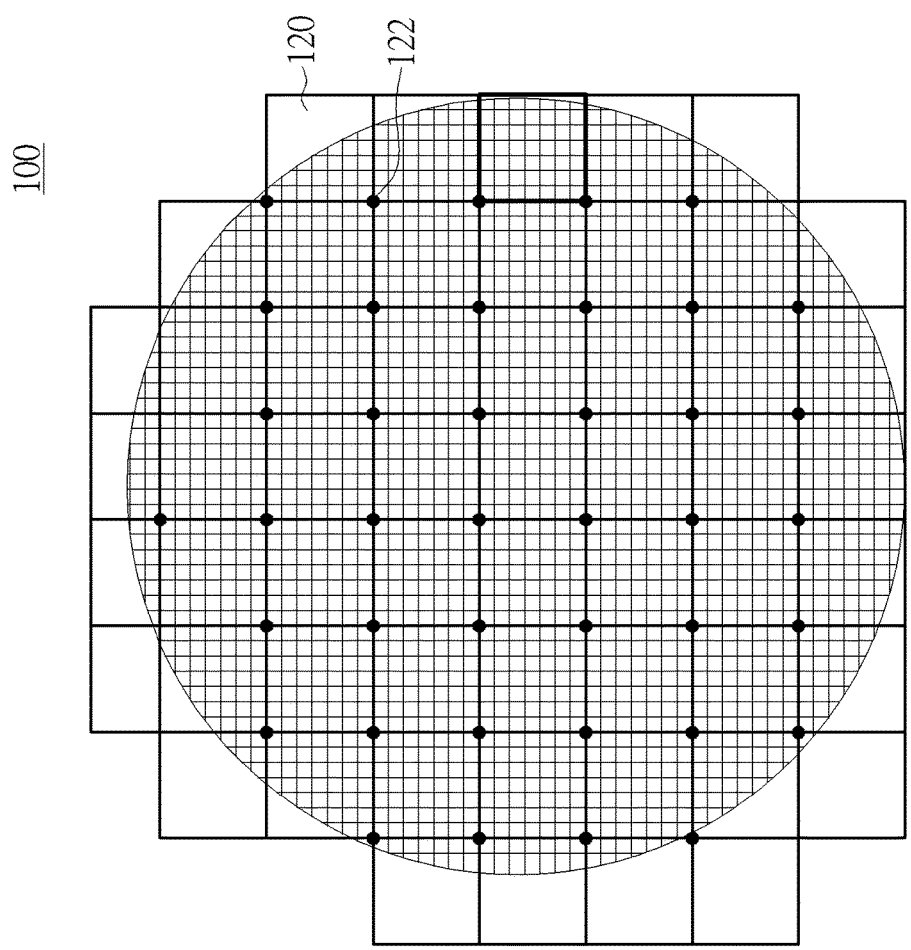
FIG. 8 is a schematic drawing illustrating a step of the method for reviewing defects provided by the preferred embodiment of the present invention.

Please refer to FIG. 7 again. According to the method for reviewing defects 20 provided by the preferred embodiment, a STEP 210 is performed:

STEP 210: Identifying a plurality of viewing fields on the semiconductor structure and recognizing a plurality of origin points respectively in the viewing fields in the defect review apparatus, and each viewing field comprising a plurality of dies formed therein Please also refer to FIG. 8, which is a schematic drawing illustrating the STEP 210 according to the first preferred embodiment. As shown in FIG. 8, after receiving the semiconductor structure 100 and the sets of coordinates locating the defects, a plurality of viewing fields 120 are identified by the defect review apparatus. As mentioned above, the viewing fields 120 are those areas referred to as shots or fields defined in the photolithography process. More important, the viewing fields 120 are areas/units that will be reviewed one by one in the defect review apparatus. As shown in FIG. 8, each viewing field 120 includes a plurality of dies 104 formed therein. Furthermore, a plurality of origin points 122 are recognized by the defect review apparatus. In some embodiments of the present invention, the origin points 122 can be the mark patterns 108. It should be understood that the origin points 122 serves as alignment marks in both of the defect inspection apparatus and the defect review apparatus such alignment between the defect inspection apparatus and the defect review apparatus is achieved and thus the coordinates locating the defects are meaningful.

Figure 9:
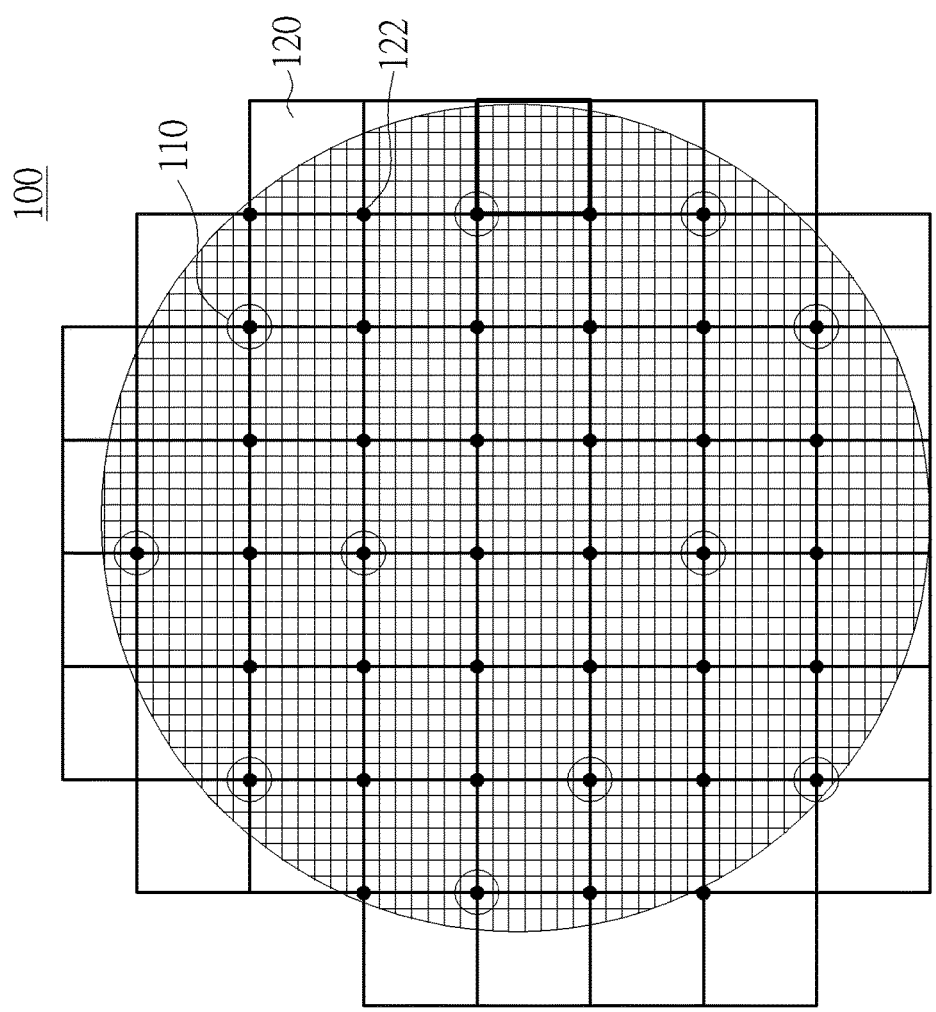
FIGS. 9-10 are schematic drawings respectively illustrating a step subsequent to FIG. 8 according to different preferred embodiments of the present invention.
Figure 10:
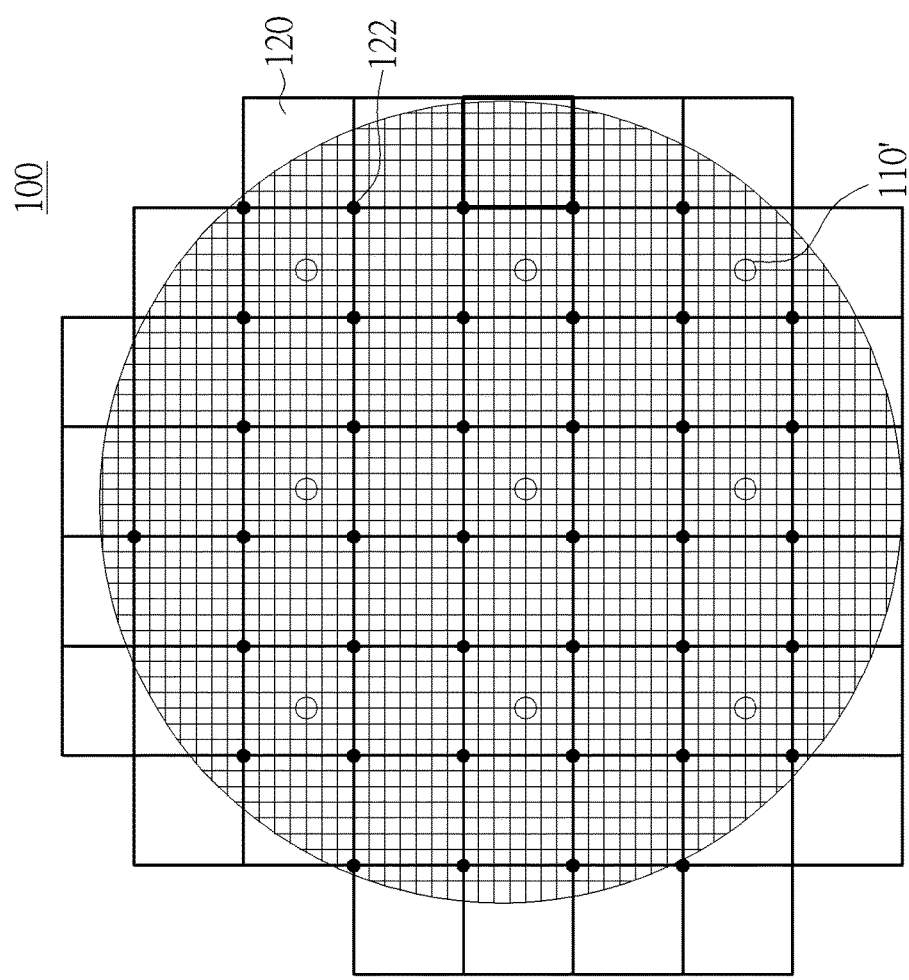

Please refer to FIG. 7 again. According to the method for reviewing defects 20 provided by the preferred embodiment, a STEP 220 is performed:

STEP 220: Performing a first review step to review a plurality of anchor patterns in the viewing fields Please refer to FIGS. 9 and 10. According to the method for reviewing 20 provided by the present invention, the first review step is performed to review a plurality of anchor patterns 110/110'. In some embodiments of the present invention, the anchor patterns 110 are formed at corners of the dies 104 located at corners of the viewing fields 120. Preferably, in some embodiments of the present invention, the anchor patterns 110 are formed at the origin points as shown in FIG. 9. In those embodiments, the anchor patterns 110 can be reviewed immediately after recognizing the origin points 122. Still in some embodiments of the present invention, the anchor patterns 110' are formed at corners of the dies 104 not located at corners of the viewing fields 120 as shown in FIG. 10. In those embodiments, the anchor patterns 110' can be reviewed according to the coordinates locating the programmed defects transferred from the defect inspection apparatus.

Please refer to FIG. 7 again. According to the method for reviewing defects 20 provided by the preferred embodiment, a STEP 230 is performed:

STEP 230: Performing an offset correction after the first review step to re-locating the plurality of defects Please refer to FIGS. 9 and 10 again. According to the method for reviewing 20 provided by the present invention, an offset correction is performed after the first review step. As mentioned above, in some embodiments of the present invention that the anchor patterns 110 are formed at the origin points as shown in FIG. 9. The offset correction is performed to calculate a deviation between the anchor pattern 110 and the origin point 122 in the viewing fields 120. The offset correction is easily accomplished because the deviation between the origin points 122 and the anchor patterns 110 can be easily obtained. Also as mentioned above, in some embodiments of the present invention that the anchor patterns 120 are formed at corners of the dies 104 not located at corners of the viewing fields 120 as shown in FIG. 10. The offset correction is performed to calculate a deviation between the sets of coordinates locating the programmed defects and the anchor patterns 110'. The offset correction is also easily accomplished because the deviation between the anchor patterns 110' and the coordinates locating the programmed defects can be easily obtained. Accordingly, the defects are re-located according to the offset correction.

It should be noted that in the conventional defect review method, user's skill based on the user experience are always required because deviation between the defects in the viewing fields of the defect review apparatus and the coordinates locating the defects transferred from the defect inspection apparatus may be too large to accurately address the defects and thus user needs to find some of the defects manually. And the offset correction cannot be performed until at least some of the defects are found. The most common problem for the aforementioned user-required procedure is time consuming.

According to the method for review defect provided by the present invention, the offset correction can be easily performed by introducing the anchor patterns 110/110' including the programmed defects 112: Since the anchor patterns 110/110' are formed at the origin points or formed within the viewings, the deviation between the anchor patterns 120 and the origin points 120 are easily obtained. Or, the deviation between the anchor patterns 120 and the coordinates derived from the inspection apparatus is easily obtained. Thus, the time-consuming defect finding procedure is no longer required. Furthermore, by introducing the anchor patterns 110/110', the offset correction can even be automatically performed by the defect view apparatus without user.

Please refer to FIG. 7 again. According to the method for reviewing defects 20 provided by the preferred embodiment, a STEP 240 is performed:

STEP 240: Performing a second review step to review the defects after the offset correction As mentioned above, the offset correction is performed to re-locate the defects, and thereafter a second review steps is performed in the defect review apparatus. Since the real defects detected by the defect inspection apparatus are re-located according to STEP 230 as mentioned above, the second review step is performed easily to find out where the real defects are and they are reviewed and analyzed to obtain greater details.

According to the semiconductor structure provided by the present invention, the anchor patterns that are different from the mark patterns are formed in the viewing fields and thus the first reviewing step is performed to review the anchor patterns. The offset correction can be easily achieved to re-locate the defects because the deviation between the origin points and the anchor patterns or the deviation between the coordinates locating the defects and the anchor patterns is easily obtained. Therefore the second reviewing step is performed to review the real defects with accurate and precise coordinates. And thus the method for reviewing defects provided by the present invention includes a high working efficiency and an improved reliability.

Those skilled in the art will readily observe that numerous modifications and alterations of the device and method may be made while retaining the teachings of the invention. Accordingly, the above disclosure should be construed as limited only by the metes and bounds of the appended claims.

What is claimed is:

1. A method for reviewing defects, comprising:
   receiving a semiconductor structure and sets of coordinates locating a plurality of defects formed thereon in a defect review apparatus;
   identifying a plurality of viewing fields on the semiconductor structure and recognizing a plurality of origin points respectively in the viewing fields in the defect review apparatus, and each viewing field comprising a plurality of dies formed therein;
   performing a first review step to review a plurality of anchor patterns in the viewing fields;
   performing an offset correction after the first review step to re-locating the plurality of defects; and
   performing a second review step to review the defects after the offset correction.

2. The method for reviewing the defects according to claim 1, wherein the sets of the coordinates are derived from a defect inspection apparatus.

3. The method for reviewing the defects according to claim 1, wherein the anchor patterns are formed at corners of the dies located at corners of the viewing fields.

4. The method for reviewing the defects according to claim 3, wherein the offset correction is performed to calculate a deviation between the anchor pattern and the origin point in the viewing fields.

5. The method for reviewing the defects according to claim 1, wherein the anchor patterns are formed at corners of the dies not located at corners of the viewing fields.

6. The method for reviewing the defects according to claim 5, wherein the offset correction is performed to calculate a deviation between the sets of coordinates and the anchor patterns.

7. The method for reviewing the defects according to claim 1, wherein the anchor patterns comprise a plurality of sub-patterns arranged within, and at least a programmed defect is formed in one of the sub-patterns.

8. The method for reviewing the defects according to claim 7, wherein the programmed defect comprises a gap defect, a short-end defect, or a bridge defect.

* * * * *